US010692924B2

(12) United States Patent
Dzurak et al.

(10) Patent No.: US 10,692,924 B2
(45) Date of Patent: Jun. 23, 2020

(54) ADVANCED PROCESSING APPARATUS COMPRISING A PLURALITY OF QUANTUM PROCESSING ELEMENTS

(71) Applicant: NewSouth Innovations Pty Limited, Sydney (AU)

(72) Inventors: Andrew Dzurak, Elizabeth Bay (AU); Menno Veldhorst, Bergschenhoek (NL); Chih-Hwan Henry Yang, Ashfield (AU)

(73) Assignee: NewSouth Innovations Pty Limited, Sydney (AU)

( * ) Notice: Subject to any disclaimer, the term of this patent is extended or adjusted under 35 U.S.C. 154(b) by 0 days.

(21) Appl. No.: 15/749,858

(22) PCT Filed: Aug. 5, 2016

(86) PCT No.: PCT/AU2016/050713
§ 371 (c)(1),
(2) Date: Feb. 2, 2018

(87) PCT Pub. No.: WO2017/020095
PCT Pub. Date: Feb. 9, 2017

(65) Prior Publication Data
US 2018/0226451 A1 Aug. 9, 2018

(30) Foreign Application Priority Data

Aug. 5, 2015 (AU) .................................. 2015903129

(51) Int. Cl.
*H01L 29/06* (2006.01)
*H01L 27/18* (2006.01)
(Continued)

(52) U.S. Cl.
CPC .............. *H01L 27/18* (2013.01); *B82Y 10/00* (2013.01); *G06N 10/00* (2019.01); *H01L 21/28* (2013.01);
(Continued)

(58) Field of Classification Search
CPC ... H01L 21/28; H01L 27/0688; H01L 27/222; H01L 29/4238; H01L 29/66984
(Continued)

(56) References Cited

U.S. PATENT DOCUMENTS 6,495,854 B1 12/2002 Newns et al.
7,830,695 B1 * 11/2010 Moon ................. G01R 33/1284
257/14
(Continued)

FOREIGN PATENT DOCUMENTS

| EP | 2075745 A1 | 7/2009 |
| WO | 2014146162 A1 | 9/2014 |
| WO | 2015184484 A1 | 12/2015 |

OTHER PUBLICATIONS

International Search Report for Application No. PCT/AU2016/050713 dated Oct. 31, 2016 (6 pages).
(Continued)

*Primary Examiner* — Tan N Tran
(74) *Attorney, Agent, or Firm* — Michael Best & Friedrich LLP (57) ABSTRACT

The present disclosure provides a scalable architecture for an advanced processing apparatus for performing quantum processing. The architecture is based on an all-silicon CMOS fabrication technology. Transistor-based control circuits, together with floating gates, are used to operate a two-dimensional array of qubits. The qubits are defined by the spin states of a single electron confined in a quantum dot.

14 Claims, 7 Drawing Sheets

(51) Int. Cl.
  *G06N 10/00* (2019.01)
  *B82Y 10/00* (2011.01)
  *H01L 21/28* (2006.01)
  *H01L 29/66* (2006.01)
  *H01L 29/423* (2006.01)
  *H01L 27/22* (2006.01)
  *H01L 29/76* (2006.01)
  *H01L 27/06* (2006.01)
  *H01L 39/02* (2006.01)
  *H01L 39/22* (2006.01)
  *H01L 39/24* (2006.01)
  *H03K 17/92* (2006.01)
  *H01L 27/10* (2006.01)

(52) U.S. Cl.
  CPC ........ *H01L 27/0688* (2013.01); *H01L 27/222* (2013.01); *H01L 29/4238* (2013.01); *H01L 29/66977* (2013.01); *H01L 29/66984* (2013.01); *H01L 29/7613* (2013.01); *H01L 39/025* (2013.01); *H01L 39/223* (2013.01); *H01L 39/2493* (2013.01); *H03K 17/92* (2013.01); *H01L 27/101* (2013.01); *Y10S 977/774* (2013.01); *Y10S 977/814* (2013.01); *Y10S 977/935* (2013.01)

(58) Field of Classification Search
  USPC .......................................................... 257/31
  See application file for complete search history.

(56) References Cited

U.S. PATENT DOCUMENTS

| | | | |
|---|---|---|---|
| 8,816,325 B2* | 8/2014 | Schenkel | H01L 29/66984 257/14 |
| 9,530,873 B1* | 12/2016 | Carroll | H01L 29/66977 |
| 2005/0026411 A1 | 2/2005 | Tanamoto et al. | |
| 2008/0297230 A1 | 12/2008 | Dzurak et al. | |
| 2011/0085381 A1 | 4/2011 | Ferrus | |
| 2013/0221330 A1 | 8/2013 | Choi et al. | |

OTHER PUBLICATIONS

International Written Opinion for Application No. PCT/AU2016/050713 dated Oct. 31, 2016 (10 pages).

Hornibrook, J.M. et al., "Cryogenic Control Architecture for Large-Scale Quantum Computing," Physical Review Applied, 2015, vol. 3, Iss. 2, published Feb. 23, 2015.

Ward, D.R. et al., "Integrating Classical Semiconductor Devices with Si/SiGe Quantum Dots," ECS Transactions, 2014, vol. 64, Issue 6, pp. 915-922, published 2014.

Bandyopadhyay, S., "Quantum Dynamic Random Access Memory (Q-DRAM)," Physics of Low-Dimensional Structures, 2001, vol. 9/10, pp. 155-160, published 2001.

European Patent Office Supplementary Search Report for Application No. 16831989 dated Feb. 2, 2019 (10 pages).

* cited by examiner

ADVANCED PROCESSING APPARATUS COMPRISING A PLURALITY OF QUANTUM PROCESSING ELEMENTS

FIELD OF THE INVENTION

The present invention relates to an advanced processing apparatus comprising quantum processing elements, and particularly, but not exclusively, to an architecture for performing quantum processing.

BACKGROUND OF THE INVENTION

The power and capacity of computing components such as microprocessors and memory circuits has been increasing for the last 50 years, as the size of the functional units, such as transistors, has been decreasing. This trend is now reaching a limit, however, as it is difficult to make the current functional units (such as MOSFETs) any smaller without affecting their operation.

The technology employed to manufacture conventional silicon integrated circuits has developed over the last 50 years and is today well established. Current microprocessors feature several hundreds of millions of transistors which are manufactured in high-throughput lines.

Developments are ongoing to implement new types of advanced processing apparatus that can implement powerful computations using a different approach than current processors. Such advanced processing apparatus promise computational capacities well beyond current devices. For example, quantum processors are being developed which can perform computations according to the rules of quantum mechanics. Approaches to the realisation of devices for implementing quantum bits (qubits), the basic computational unit of a quantum processor, and quantum architectures, have been explored with different levels of success.

The most promising routes towards large-scale universal quantum computing all require quantum error correction, a technique that enables the simulation of ideal quantum computation using realistic noisy qubits, provided that the noise is below a fault-tolerant threshold.

Some quantum error correction methods, such as the 'surface code', allow for error thresholds as high as 1%. Such errors levels can be achieved using a number of qubit platforms. However, the implementation of the surface code requires a large number of qubits and therefore a platform that can be scaled-up to a large number of qubits, such as $10^8$. The requirement for such a large number of qubits creates a challenge in the field of quantum computing, even for the most promising platforms.

In order to manufacture an 'error-corrected quantum computer', a scalable architecture is required. Such architecture would ideally incorporate large numbers of qubits, disposed in relatively close proximity to each other, operating in synergy to implement error-corrected quantum computation. In addition, the architecture should be feasible to manufacture.

SUMMARY OF THE INVENTION

In accordance with the first aspect, the present invention provides an advanced processing apparatus, comprising:
a plurality of quantum processing elements arranged in a matrix; each processing element comprising silicon and a dielectric material forming an interface and an electrode arrangement suitable to confine one or more electrons or holes in the silicon to form a quantum dot operable as a qubit;
a plurality of control members disposed about the processing elements; each control member comprising one or more switches arranged to interact with the electrode arrangement to perform quantum operations with the processing element; and
a plurality of control lines; each control line being connected to a plurality of control members to enable simultaneous operation of a plurality of processing elements.

The quantum operations may comprise any one of initialisation, quantum control and readout of the processing element.

In an embodiment, the electrode arrangement comprises one or more electrodes which are controllable to form the quantum dot and operate the quantum dot as a qubit.

In an embodiment, the one or more switches comprise integrated transistors which interact with electrodes of the electrode arrangement. The transistors may be field effect transistors. Alternatively, magnetic switches may be used to interact with electrodes of the electrode arrangement.

Advantageously, the processing elements may be arranged in a 2D matrix along an interface which is formed between a silicon layer and a dielectric layer. The interface, the silicon layer and the dielectric layer may be shared by the processing elements. The electrode arrangement may be disposed onto the dielectric layer and the quantum dot formed in proximity of the interface. The electrodes and the control members may have a three-dimensional structure and extend in a direction perpendicular to the interface. In embodiments, the control members are disposed in a section of the apparatus above the electrode arrangement.

In an embodiment, each processing element of the apparatus is associated with at least two control members.

The first control member may be arranged to provide a biasing voltage to form the quantum dot and the second control member may be arranged to operate the quantum dot as a qubit. The biasing voltage applied to the first control member may be tuned to calibrate the processing element and ensure that the processing elements in the matrix are in the same initial condition.

In embodiments, each control line is oriented along a row or a column of the 2D matrix of processing elements and is capable of interacting with all the processing elements disposed along the row or column.

The control lines may be arranged in a manner such that the biasing voltage is applicable to the first control member of selected processing elements to form the quantum dots, and also to select the processing element for quantum operation. Further, the control lines may be arranged in a manner such that a control voltage is applicable to the second control member of the selected processing elements to operate the qubits.

The control lines may be also be operated to facilitate exchange coupling between two processing elements disposed at two locations of the matrix. In addition, the control lines may be arranged to facilitate capacitive coupling between two processing elements disposed at two locations of the matrix. The two locations may be neighbouring locations.

In some instances, a multiplexing assembly may be used to multiplex a plurality of control lines.

In some embodiments, the apparatus further comprises transistors arranged to provide classical computing capabilities to the apparatus. These transistors may be also used to compute a portion of a problem which cannot be computed using the matrix of processing elements. Classical computing capabilities may also be provided by an external classical processing apparatus.

In some embodiments, the electrode arrangement is operable to form the quantum dot and tune the quantum dot so that the energy at which the state of the qubit is affected can be adjusted over a range of energy values. The electrode arrangement may be also operable to control a quantum property of the quantum dot, such as electron or hole spin, to operate the quantum dot as a qubit.

The qubit logic states may be controlled by voltages applied to the electrode arrangement to tune an exchange interaction between spins of electrons or holes of the quantum dots, or to tune a capacitive interaction between one or more electrons or holes. The electrode arrangement may be operable to tune the electron or hole spin resonance frequency of the quantum dot and/or electrically drive the electron or hole spin resonance frequency of the quantum dot.

In embodiments, the electrode arrangement is arranged to confine electrons or holes in the silicon to form at least two quantum dots for encoding qubit logic states.

Furthermore, the apparatus may comprise a generator for bathing the processing elements in electromagnetic radiation for affecting the spin of the electrons or holes.

In embodiments, the dielectric material comprises silicon dioxide and the silicon comprises predominantly $^{28}$Si.

In accordance with the second aspect, the present invention provides an advanced processing apparatus comprising a plurality of multi-qubit modules; each multi-qubit module comprising an apparatus in accordance with the first aspect. The plurality of multi-qubit modules may be interconnected by interconnecting members which may comprise superconducting resonators or spin-buses.

Advantageously, this configuration allows to implement an advanced processing apparatus with a large number of quantum bits. Dividing the qubits in modules allows managing the level of complexity of the control lines for each module.

In accordance with the third aspect, the present invention provides a method for operating an advanced processing apparatus in accordance with any one of the preceding claims; the method comprising the steps of:
  applying electrical signals to a plurality of control lines to initialise at least a portion of the processing elements;
  applying electrical signals to a plurality of control lines to select a plurality of processing elements for quantum operation;
  applying electrical signals to a plurality of control lines to perform quantum operations using selected processing elements;
  applying electrical signals to a plurality of control lines to readout the quantum state of selected processing elements.

In embodiments, the method further comprises the step of applying electrical signals to a plurality of control lines to calibrate the processing elements and to form quantum dots for each of the processing elements.

In accordance with the fourth aspect, the present invention provides an advanced processing apparatus in accordance with the first aspect or the second aspect and a classical computing apparatus, wherein the classical computing apparatus controls the advanced processing apparatus to perform a quantum algorithm.

In some embodiments, the advanced processing apparatus and the classical computing apparatus can work in synergy to compute a solution of a computing problem.

In accordance with the fifth aspect, the present invention provides an advanced processing apparatus, comprising:
  a plurality of quantum processing elements arranged in a 2D matrix; and
  a plurality of control members comprising silicon field effect transistors disposed above the quantum processing elements and interconnected to form a matrix of control members;
  wherein the field effect transistors are arranged to operate the quantum processing elements to enable quantum processing.

In accordance with the sixth aspect, the present invention provides a method for manufacturing an advanced processing apparatus comprising the steps of:
  providing a silicon substrate;
  forming a silicon 28 layer;
  forming a dielectric layer in a manner such that the dielectric layer and the silicon 28 layer form an interface;
  forming a plurality of electrodes suitable to confine one or more electrons or holes about the interface to define a plurality of quantum dots operable as a qubits;
  forming a plurality of control members comprising switches arranged to interact with the plurality of electrodes; and
  forming a plurality of control lines; each control line being connected to one or more control members to enable simultaneous operation of a plurality of processing elements;
  wherein the plurality of electrodes, control members and control lines are formed by using a MOS manufacturing process.

In accordance with the seventh aspect, the present invention provides an advanced processing apparatus, comprising:
  a 2D array of quantum processing elements; and
  a plurality of control members comprising field effect transistors disposed above the quantum processing elements and interconnected to a plurality of control lines;
  wherein the processing elements are addressable via the control lines using a DRAM addressing technique.

Advantageous embodiments of the present invention provide a quantum processing architecture comprising a matrix of quantum processing devices. The quantum processing devices use the quantum properties of electrons or holes confined in proximity of a silicon/silicon dioxide interface to implement qubits. The apparatus comprises an electrode arrangement used to confine the electrons or holes and operate the qubit, control members and control lines which can be used to address multiple qubits at the same time.

Advantageously, the architecture is realised in silicon and can potentially be manufactured using techniques which are compatible with current silicon microelectronic fabrication technologies and CMOS nodes. This makes the architecture easy to scale to large numbers of qubits.

BRIEF DESCRIPTION OF THE DRAWINGS

Features and advantages of the present invention will become apparent from the following description of embodiments thereof, by way of example only, with reference to the accompanying drawings, in which;

FIG. 2 shows a stack of layers for manufacturing an architecture in accordance with embodiments (a) and a simplified schematic of control lines used to control qubits (b).

DETAILED DESCRIPTION OF EMBODIMENTS

In the following description an advanced processing apparatus and method for operating an advanced processing apparatus are described. The advanced processing apparatus comprises a plurality of quantum processing elements arranged in a matrix. The processing elements comprise a silicon/dielectric interface and an electrode arrangement suitable to confine one or more electrons or holes in the silicon, in proximity of the interface, to form one or more quantum dots which are operable as a qubit. The apparatus also comprises a plurality of control members disposed about the processing elements. The control members include switches which interact with the electrodes to enable quantum operations. A plurality of control lines is connected to the control members to enable simultaneous operation of a plurality of processing elements.

Figure 1A:
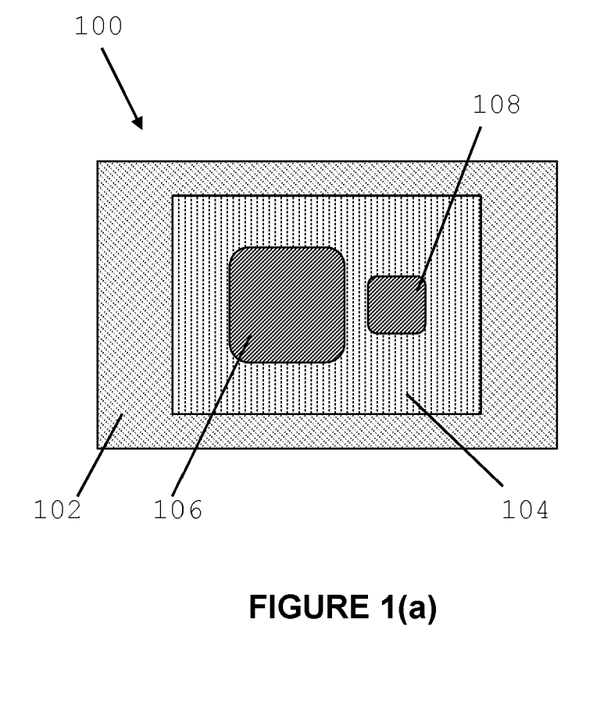
FIG. 1 shows schematic views of a processing element of the apparatus in accordance with embodiments.
Figure 1B:
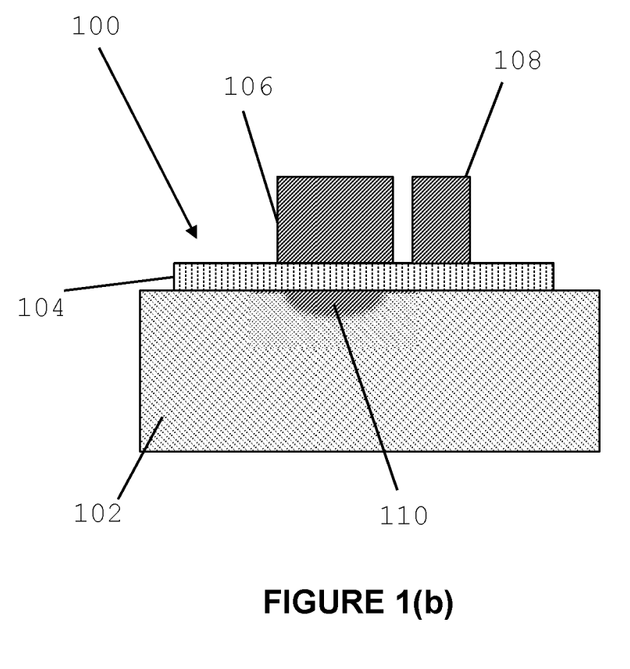

Referring to FIG. 1, there are shown two simplified views of a processing element 100 used in the apparatus. FIG. 1(a) is a top view and FIG. 1(b) is a side cross sectional view. In the embodiment described, the processing element comprises a silicon substrate 102 and a dielectric 104, in this example being silicon dioxide. Isotopically enriched silicon $^{28}$Si is used. The isotopically enriched silicon $^{28}$Si 102 may be an epitaxial layer grown on a conventional silicon substrate.

The implementation of a spin qubit in a silicon/silicon dioxide system provides increased spin coherence compared with most compound semiconductors due to the reduced hyperfine coupling of the qubit to nuclear spins in the host crystal. The two dimensional electron gas confined at the silicon/silicon dioxide interface can be depleted to isolate quantum dots containing a small number of electrons by using an electrostatic field.

A first electrode 106 is operable to form a quantum dot in proximity of the interface. FIG. 1(b) shows an area 110 where either electrons or holes may be isolated. Sufficiently positive voltages applied to electrode 106 will cause electrons to be isolated in the area 110, while sufficiently negative voltages applied to electrode 106 will cause holes to be isolated in area 110.

For example, a single electron can be isolated in area 110, thus forming an isolated quantum dot. A single qubit can be encoded in the spin of the isolated electron. Alternatively, a qubit can be encoded using the spins of multiple electrons or holes in a single quantum dot. Additional electrode structures can also be employed to aid in confinement of the quantum dots, or form more than one quantum dot. In an alternative embodiment, a single qubit can be encoded on the spin of one or more electrons or holes of respective one or more quantum dots. Further elements can also be introduced at the interface to promote electron confinement, such as doped regions or dielectric regions. In addition, the overall concentration of electrons at the interface may be modified using an isolated global electrode above or below the interface.

Electrode 108 is arranged to interact with the quantum dot, or quantum dots, formed using electrode 106 so that quantum operations can be performed. The control of the qubit is generally obtained through an electromagnetic signal through electrode 108. In particular, electrode 108 can be used to readout, control and couple the respective qubit. For example, electrode 108 can be used to control the effective g-factor of the electrons or holes forming the quantum dot, or quantum dots. Alternatively, electrode 108 can be used to directly control the spin of the electrons or holes using an AC electric field. A DC magnetic field is also applied to split the quantum states and thereby define the logical basis states of the qubit.

Electrode 108 is also used to facilitate coupling of different qubits via the exchange interaction or capacitive interaction to perform two qubit operations.

In the scalable quantum computing architecture described herein, a large number of qubit structures configured in accordance with the principles discussed above and illustrated in FIG. 1, operate together to perform error corrected quantum computation. Before qubit operations are performed, the qubits are tuned to have the same starting electrostatic conditions by applying a tuning potential to gate 106.

It had previously been thought that a Si/SiO$_2$ interface would have too many defects, or that the SiO$_2$ would contain too many random charge centres, to allow realisation of a quantum dot that could be used as a qubit. In comparison with other semiconductor interfaces that can be used to confine quantum dots, such as the Ga/GaAs interface, the Si/SiO$_2$ interface is a relatively high disorder environment and therefore was thought not conducive to qubit operation. This has subsequently been shown to not be the case, and good quality qubits have been recently demonstrated by the Applicants in such Si/SiO$_2$ systems.

The Applicants have also discovered that, surprisingly, the frequency of the AC electromagnetic signal required to interact with the qubit in its single electron mode can be varied by tuning the g-factor of the electron, and therefore also its Zeeman energy. The ability to tune the qubit facilitates the operation of the advanced processing apparatus and allows operating the architecture with many qubits. The qubits can be addressed or controlled by varying the effective g-factor of the electrons or holes of the qubit. This control technique allows for the addressing of qubits individually or in groups.

Figure 2A:
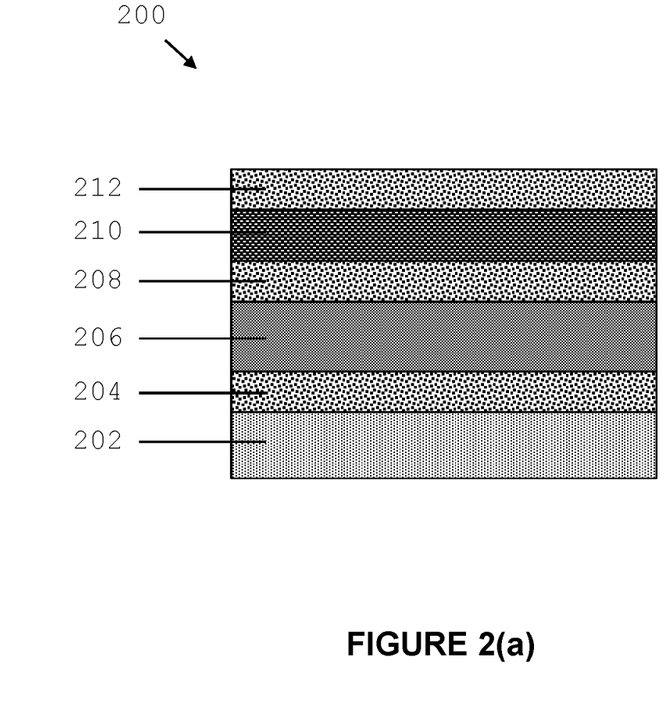

Referring now to FIG. 2(a), there is shown a stack of layers 200 which can be used to manufacture a quantum computing architecture in accordance with embodiments. Structure 200 comprises an n-type doped (natural) silicon 202 that is used as a conductive back-plane and a SiO$_2$ layer 204 that is used as a template insulator layer. Isotopically purified silicon-28 206 is the host material for the qubits. Further dielectric layers 208 and metallically-doped polysilicon, or metallic, layers 210 allow forming transistors and electrodes that can be used to control the quantum bits. A further region 212 is used to host the metallic control lines to control the transistors.

Variations of materials or layer configuration could be used in alternative embodiments. For example additional semiconductor layers on top of the structure could be used to allow for more components. The fabrication of these stacks can utilize technologies developed within the rapidly evolving field of three-dimensional silicon integrated circuits.

Figure 2B:
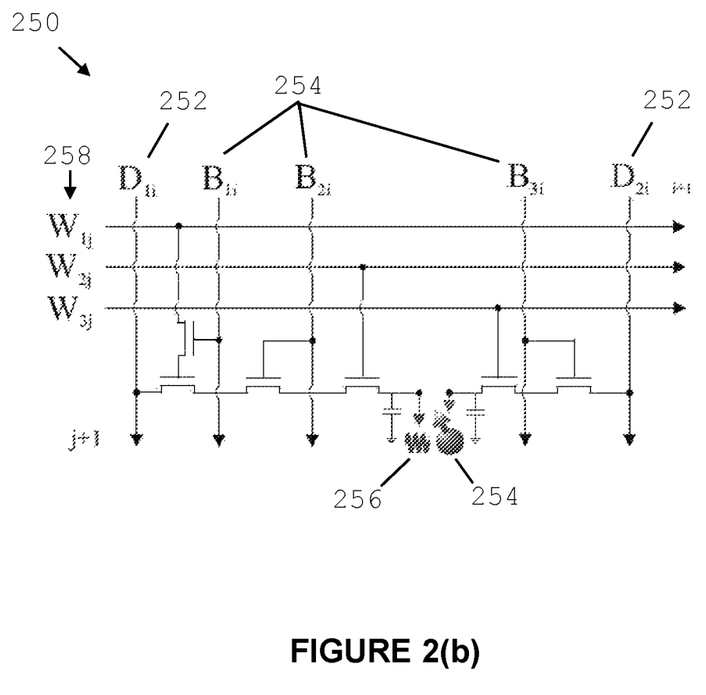

FIG. 2(b) shows a schematic 250 with control lines configured to control qubits. Data lines $D_i$ (252) are interconnected to corresponding qubits $Q_i$ (254), to tune the qubit resonance frequency ($v_i$), as well as to each J-gate 256 to control the exchange coupling between qubits. To provide individual, row, or global qubit addressing, the data lines are controlled by a combination of word lines W (258) and bit lines B (260). Assuming the minimal width of, and separation between, the gates and doped regions is equal to the minimum feature size λ, the classical circuit occupies an area $80\lambda^2$ per qubit. Modern large semiconductor fabrication facilities are capable of manufacturing CMOS transistors with feature size down to 7 nm. Therefore each quantum dot qubit (including half the barrier area that separates the qubits) would occupy an area of ≈63 nm·63 nm, consistent with experimental realizations of silicon quantum dot qubits.

Figure 3:
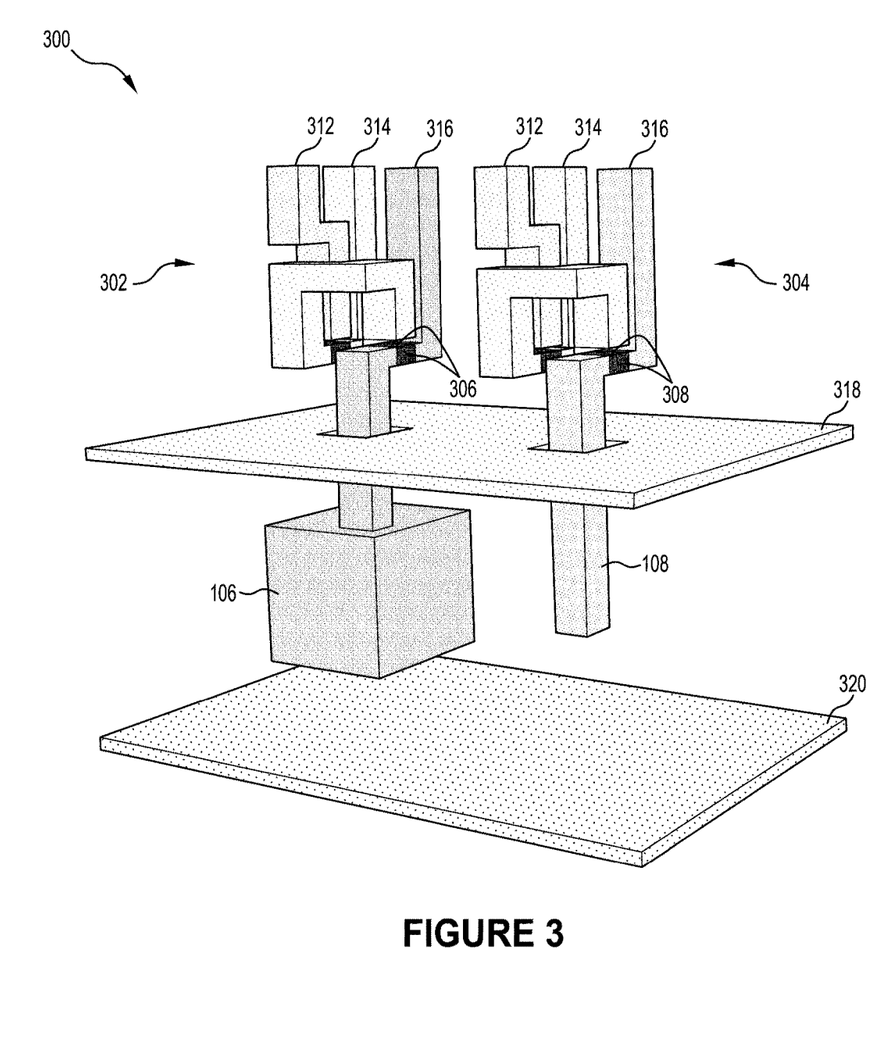
FIG. 3 is a schematic view of an electrode structure in accordance with embodiments.

Referring now to FIG. 3, there is shown a 3D schematic view 300 of a possible configuration of electrodes and respective overlaying control members 302 and 304. Control member 302 comprises two transistors 306 which allow interconnecting one or more of the control lines, connected to control member 302, to the respective electrode (106). Control member 304 comprises two transistors 308 which allow interconnecting one or more of the control lines, connected to control member 304, to the respective electrode (108). The control lines include word lines 312, bit lines 314 and data lines 316.

A ground plane (318) is used to avoid capacitive crosstalk and can be realised such as to have the required coupling to each gate. A back electrode 320 can be used to modify the overall concentration of electrons across the interface to optimise the properties of the quantum dots.

The electrodes configuration shown in FIG. 3 and the structure of the respective processing element, schematically shown in FIG. 1, are compatible with current CMOS technology nodes.

Figure 4:
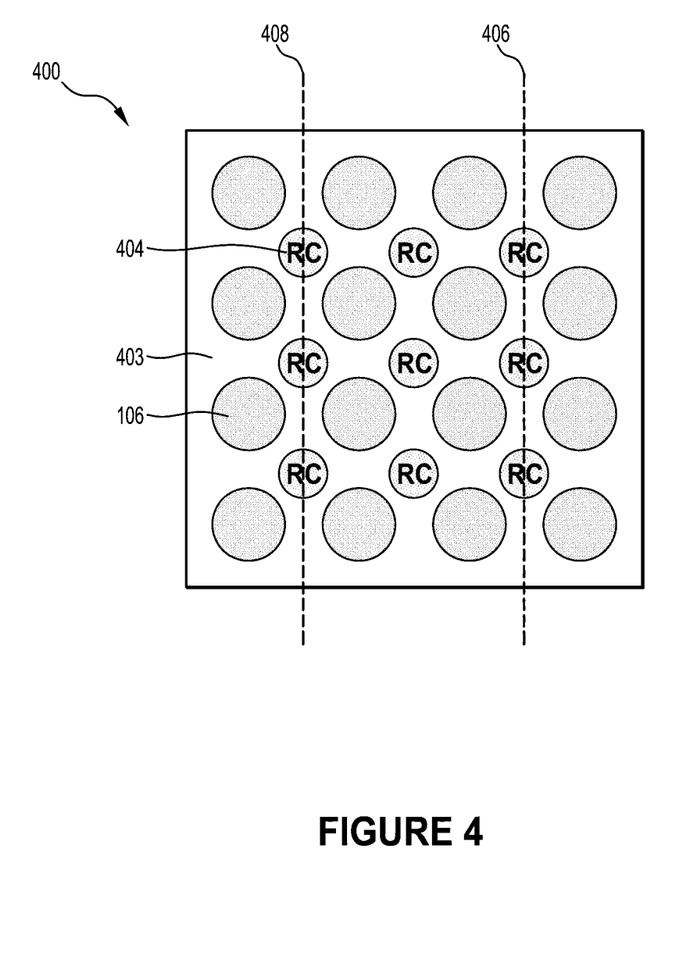
FIG. 4, shows a schematic top view of an architectural layout in accordance with embodiments.

Referring now to FIG. 4, there is shown a schematic top view 400, of a layout of electrodes which can be used to form and control a plurality of qubits arranged in a 2D-matrix in accordance with embodiments. Electrodes 402 are used to form quantum dots in the silicon 28 material 403, which is separated from the electrodes by a dielectric layer. Electrodes 404 are used to operate the quantum dots as qubits and perform quantum operations.

Figure 5:
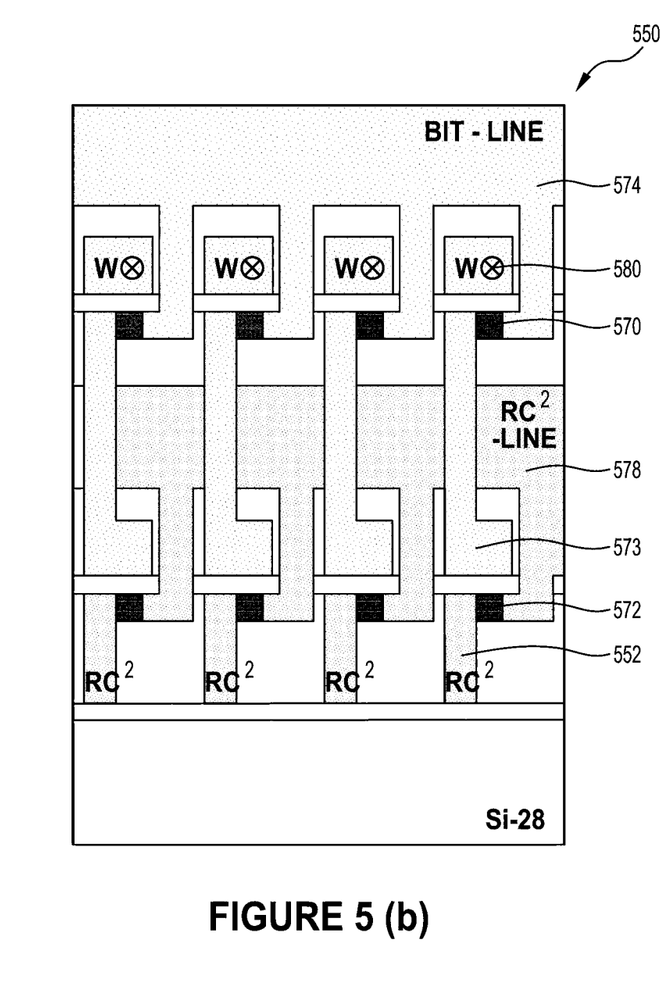
FIG. 5 shows two schematic cross sectional views of an architectural layout in accordance with embodiments.

FIG. 5(a) and FIG. 5(b) respectively show schematic cross sectional views 510 and 550 of architectural layouts which can be used to implement the general configuration of FIG. 4. Structure 510 is a side view of a section of architecture 400 along dotted line 406, while structure 550 is a side view of a section of architecture 400 along dotted line 408. In the architecture of FIG. 5 each qubit is encoded on the spin of a single quantum dot 512. The quantum dots 512 are formed using electrodes 514.

Electrodes 514 are connected to a plurality of control lines via control members comprising electronic switches, provided in the form of transistors 518 and 520 (the reference numerals in FIG. 5 point to the channels of the transistors). The plurality of control lines comprises: bit-line 524, which can connect to electrodes 513 via the transistors 520; data-line 526, which can connect to electrodes 514 via the transistors 518; and word-lines 530. Each electrode 514 can be set to the voltage of the data-line when the corresponding bit-line and word-line are set to a high voltage (digital high state).

A similar layout can be used to implement the electrodes which perform the quantum operations 552. These electrodes are located, respectively, in proximity of the quantum dots and are arranged to interact with the quantum dots to perform quantum operations such as readout, control and coupling of qubits. Electrodes 552 are connected to a plurality of control lines via control members comprising electronic switches, provided in the form of transistors 570 and 572. The plurality of control lines comprises: bit-line 574, which can connect to electrodes 573 via the transistors 570; read-couple-control (RCC) line 578, which can connect to electrodes 552 via the transistors 572; and word-lines 580.

The layouts of FIG. 5 provide advantages for both sequentially tuning the quantum dots and for simultaneous operation. These advantages will be discussed in more detail with reference to FIG. 7.

Generally, the most compact classical circuits have different geometries from quantum circuits, which consist of circular (or square) qubits. The situation is further complicated by the geometrical layout of the metal lines, determined by the quantum error correction implementation. By using the interconnections layers described above, the Applicants have overcome the complexity in scaling these differently sized circuit components. As the number of qubits increases, the input region, the transistor region and the qubit region of the structure become similar in size and shape. This point is reached upon expanding the structure to host 480 qubits. Further scaling becomes a straightforward replication of the 480 qubit module.

Figure 6:
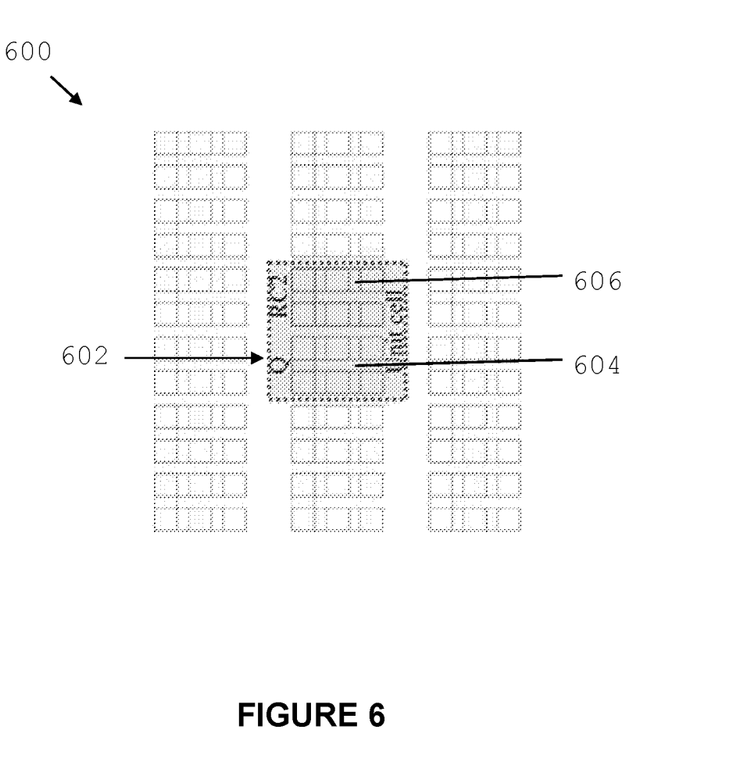
FIGS. 6 and 7 show schematic representations of a portion of an architecture in accordance with embodiments.

Referring now to FIG. 6, there is shown a schematic representation 600 of a section of an architecture comprising a plurality of quantum bits. A unit cell 602 used to operate a single quantum bit is shown. The unit cell has two sections 604 and 606. Section 604 is used to form, tune and calibrate the qubit. Section 606 is used to perform quantum operations such readout, control and coupling of qubits. Unit cell 602 represents a top view of the structure described with reference to FIG. 3.

Unit cell 602 has an 8 by 6 footprint. Using the available 7 nm CMOS fabrication node, for example, unit cell 402 would have a size of 42 nm by 56 nm. These dimensions allow the integration of a large number of qubits on a single chip providing potential for substantial scalability of the architecture. Suitable quantum dot qubits with comparable dimensions have been realised by the Applicants and are described in PCT Application n. PCT/AU2014/000596.

Figure 7:
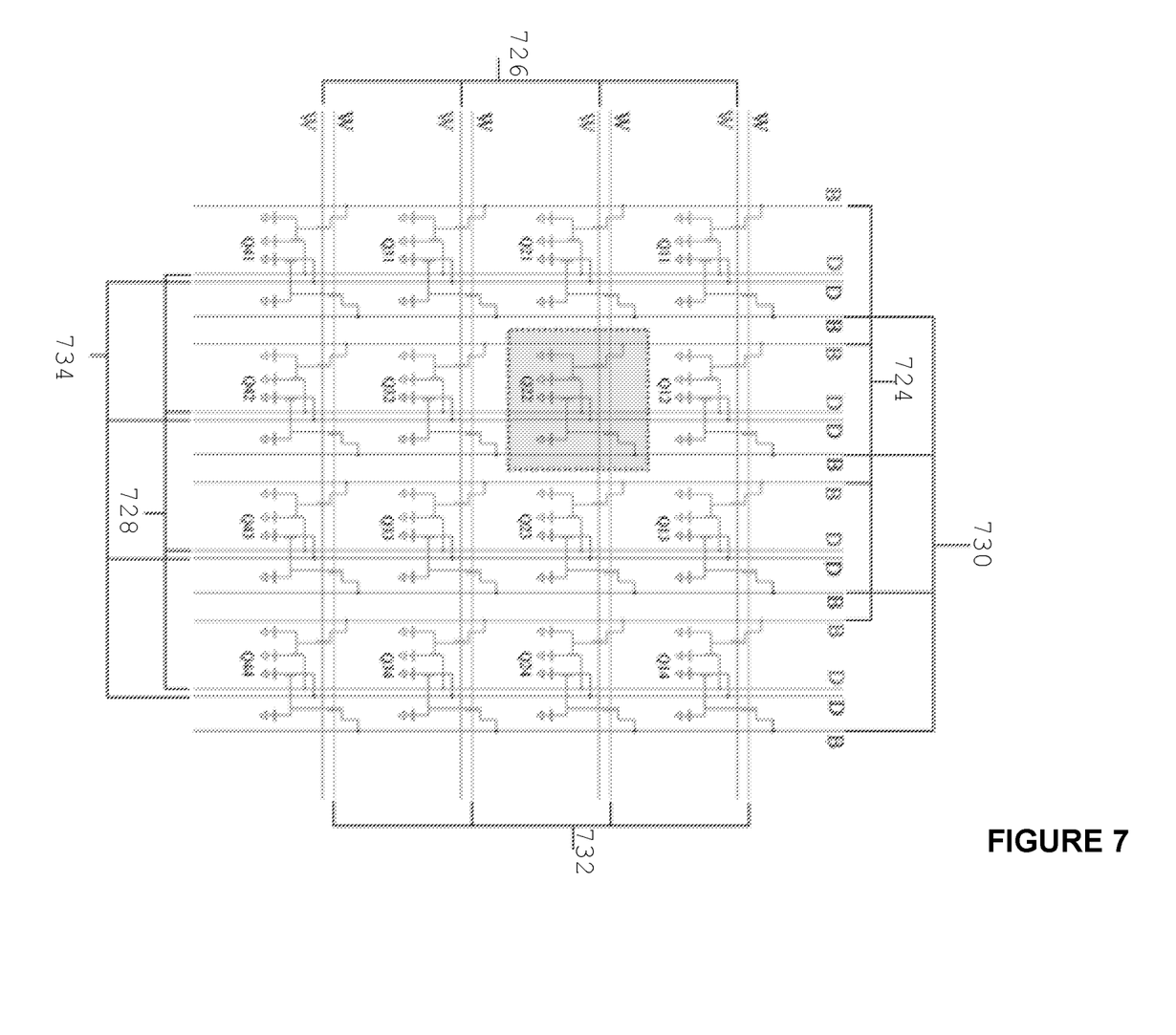

Referring now to FIG. 7 there is shown a diagram 700 of a portion of an architecture realised in accordance with embodiments. Diagram 700 shows, in a schematic way, the connections between the control lines, the control members and the processing elements.

In one embodiment, the processing elements in structure 700 can be initialised as follows: first all the qubits are initialized using bit-lines 724, word-lines 726 and data-lines 728, which are connected to respective control members' transistor channels and electrodes (shown in FIG. 5 as reference numerals 520 and 514 respectively). The sequence starts by setting the first word-line 726 to high. Then the respective bit-line 724 is turned high and the qubit located at the intersection of the bit-line and the word-line can be tuned using a voltage applied to the corresponding data-line 728.

After initialization, the bit-lines 724 are turned off. This process can be performed for individual bit-lines or for all the qubits disposed along one word-line 726, by cycling the bit-lines 726 together, such that row after row can be set, or operating all the bit-lines simultaneously. These sequences can be routinely performed.

Operation of the qubits can be implemented using bit-lines 730, word-lines 732 and data-lines 734, which are connected to respective control members' transistor channels and electrodes (shown in FIG. 5 as reference numerals 570 and 552 respectively). To perform qubit operations one or more of the bit-lines 730 and one or more of word-lines 732 can be set to a high voltage (digital high state) to select a plurality of qubits positioned at the intersections of these lines. Q-qubit operations can then be performed by applying appropriate voltage signals to the corresponding data-line.

A possible way to operate qubits simultaneously using architecture 700 comprises the following steps:

begin by setting a high state to the word-lines 726;
setting to high the bit-lines 724 to the qubits that need to be addressed;
turning the respective word-lines 726 to the state low, turning the bit-lines 724 to low;
turning the operation word-lines 732 to high for the qubits that need to be operated;
setting the respective bit-lines 730.

The process is continued until all the qubits are set to the correct state. When the data-lines 734 are turned to high, they only connect to the qubits that need to be addressed and a qubit operation can be performed.

The initialisation of the qubits can be done very fast, with a time that depends on the size of the 2D array, but well within the coherence time of the qubits. During this time, the qubits could be operated so as to echo out any environmental noise, specifically low-frequency noise. Furthermore, the process of setting the bit-lines 524 for the qubits to be addressed can be used for both single- and two-qubit operations.

In embodiments, a plurality of switches and capacitors could be used per qubit. Additionally, multiple switches and capacitors can be used to control the qubit coupling.

The switches that connect to the qubits also allow individual tuning and definition of each qubit. Advantages of this architecture are provided by the periodic and fast tuning capabilities.

After turning the corresponding control lines to low, the charge stored on the respective electrodes 514 or 552 of FIG. 5 keeps the qubits tuned to the desired state. A similar type of charge storage capacitor is well established in DRAM memory systems. We note that the voltage on the electrodes 514 and 552 of FIG. 5 can tune the number of electrons in each dot, as well as the electric field that determines the effective g-factor and associated resonance frequency, and also the location of the quantum dot. The qubit coupling can be controlled either via a detuning created by multiple electrodes, or using the direct tunnel coupling set by a single electrode (552 in FIG. 5).

In some embodiments, the state of the qubits can be read out by using Pauli spin blockade or by the Zeeman splitting energy. This type of readout can be implemented by using neighbouring dots, or using electron reservoirs. The state of the qubits can also be read out using dispersive readout techniques, such as those described in Colless et al., Phys. Rev. Lett. v110, p 046805 (2013).

In the architecture described herein, the resonance frequency of the qubit state for dispersive readout can be engineered via on-chip capacitances, such that each qubit along a row has an independent resonance frequency. By multiplexing these frequencies it is possible to readout the state of all qubits along one row simultaneously.

The addressability of the qubits in architecture 700 opens the prospects for scalability, and the integration of many qubits on a single chip, with global AC magnetic fields applied via a cavity resonator or on-chip transmission lines to realise single qubit operations.

Architecture 700 can be realised using poly-silicon electrodes and complementary metal-oxide-semiconductor (CMOS) manufacturing technologies that are currently used to fabricate more than one billion transistors on a single chip.

The architecture described demonstrates that an array of single electron spins confined to quantum dots in isotopically purified silicon can be controlled using a limited number of control lines. We have shown that the often argued compatibility of silicon spin qubits with standard CMOS technology is non-trivial. However, in the case of quantum dot qubits, the fabrication can be made consistent with standard CMOS technology and be scaled up to contain thousands to potentially even millions of qubits, while the resulting transistor overhead constrains the minimum qubit size to within experimentally demonstrated qubits. The combination of ESR-control, exchange coupling and dispersive readout enables to perform surface code operations with this platform. A key advantage is the possibility of global qubit control, such that many qubits can be addressed within the qubit coherence time.

The architecture for control and operation as presented is highly generic and can be implemented in a number of platforms, such as spin qubits based on SiGe, including single spin qubits, singlet-triplet qubits, exchange-only or hybrid qubits. While the fabrication on a single SOI wafer has been presented herein, a more advanced and complex fabrication process could include multiple stacked layers to allow for more complex classical electronics per qubit, or for a separate control circuit that is purely dedicated for calibration and stability.

The operation temperature of the architecture can range from zero Kelvin up to liquid Helium temperatures. Operation at liquid Helium temperatures provides larger cooling power, whereas operation in the milli-kelvin regime provides smaller charge noise and smaller thermal broadening. The specific operation of the qubit system in different embodiments is related to the operation temperature. The possibility of operation at higher temperatures is a strong benefit of this architecture in relation to prior art systems (e.g. superconducting circuits) and mitigates an important problem related to cooling.

The dynamic power dissipation of CMOS inverters takes up about 80% of the total power dissipation in technology nodes up to 0.35 µm, and dynamic power dissipation is even more important at low temperatures. As the dynamic power dissipation is proportional to capacitance, supply voltage, average number of transitions per clock cycle with a given frequency, and the frequency, the power dissipation can easily reach 1 Watt when millions of qubits are operated. Operation at liquid helium temperatures, above 1 Kelvin, is therefore a strong benefit. Alternatively, low voltage switches could be used, which would benefit from the low temperature operation.

The silicon-metal-oxide-semiconductor dot qubits described herein are particularly suited to be operated at higher temperatures, as other states that could potentially couple to the qubit states are lifted to higher energies. For example, the strong electrical confinement and corresponding large electric fields, together with the sharp boundary at the interface, leads to orbital states that are many milli-electronvolts (meV) away from the qubit states. Additionally, the valley states are also lifted to energies that can be as large as one milli-electronvolt (meV), such that qubit control and readout is possible up to several Kelvin.

Depending on the operation mechanism of the qubit system, the control lines have to support a certain range of frequencies. Specifically, the design in FIG. 5 is suitable for operation with lines that support up to ~GHz, consistent with current CMOS technology standards. In the case of operation using electron-spin-resonance, one large cavity that supports frequencies in the tens of gigahertz can be used. Ground planes are used to avoid capacitive cross talk and are realized such that they have the required coupling to each gate.

The realisation of dense and large 2D arrays of qubits is facilitated by embodiments of the present disclosure. Additional spaces that allow, for example, more switches per qubit can be realized by changing the readout methods. For example, two or more dots could be used to facilitate the dispersive readout.

The architecture described herein could work as a single large 2D array. Alternatively, the 2D array could be used to construct very large 2D arrays by combining smaller 2D arrays, or multi-qubit modules. The multi-qubit modules could be coupled using 2D arrays as well, or long-range coupling could be realized using methods like superconducting resonators, spin-buses, or other mechanisms that provide the required long-distance coupling.

In the above embodiments the dielectric is silicon dioxide. The invention is not limited to this dielectric, however, and other dielectrics, such as Hafnium-oxide, may be utilised in place of $SiO_2$.

In some of the embodiments described above, the quantum state affected is spin. The "spin" is the spin of a single electron, or the spin of a single hole, or may be the composite spin of two or more electrons or holes, for qubits utilising two or more electrons or holes.

The above embodiments describe qubits formed by one, two or three quantum dots. Qubits may be formed by four or more quantum dots. The invention is not limited to one, two or three quantum dot qubits.

Throughout this specification the term "effective g-factor" is used broadly to indicate a ratio between the spin resonance frequency for the spin system and the DC magnetic field.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. An advanced processing apparatus, comprising:
a plurality of quantum processing elements arranged in a 2D matrix; each processing element comprising silicon and a dielectric material forming an interface and an electrode arrangement suitable to confine one or more electrons or holes in the silicon, for each quantum processing element, to form a quantum dot operable as a qubit;
a plurality of interconnected control members forming a matrix of control members; each control member comprising a silicon metal-oxide-semiconductor transistor disposed above a respective quantum processing element and configured to interact with the electrode arrangement to perform quantum operations with the processing element; and
a plurality of control lines; each control line being connected to a plurality of control members via the metal-oxide-semiconductor transistors to enable simultaneous operation of a plurality of processing elements.

2. The apparatus of claim 1 wherein the quantum operations comprise any one of initialisation, quantum control and readout of the processing element.

3. The apparatus of claim 1 wherein the electrode arrangement comprises one or more electrodes which are controllable to form the quantum dot and operate the quantum dot as a qubit.

4. The apparatus of claim 1 wherein the processing elements are arranged in the 2D matrix at the interface which is formed between a silicon layer and a dielectric layer; the interface, the silicon layer and the dielectric layer being shared by the processing elements.

5. The apparatus of claim 4 wherein the electrode arrangement is disposed onto the dielectric layer and the quantum dot is formed within the silicon layer and in proximity of the interface.

6. The apparatus of claim 4 wherein each control line is arranged along a row or a column of the 2D matrix of processing elements and is capable of interacting with all the processing elements disposed along the row or column.

7. The apparatus of claim 1 wherein each processing element is associated with at least two control members.

8. The apparatus of claim 7 wherein a first control member is arranged to provide a biasing voltage to form the quantum dot and a second control member is arranged to operate the quantum dot as a qubit.

9. The apparatus of claim 8 wherein a first set of control lines is arranged in a manner such that the biasing voltage is applicable to the first control member of selected processing elements to form the quantum dots.

10. The apparatus of claim 1 wherein the electrode arrangement is operable to form the quantum dot and tune the quantum dot so that the energy at which the state of the qubit is affected can be adjusted over a range of energy values.

11. The apparatus of claim 1 wherein the electrode arrangement is operable to control a quantum property of the quantum dot to operate the quantum dot as a qubit.

12. The apparatus of claim 10 wherein the electrode arrangement is operable to tune the electron or hole spin resonance frequency of the quantum dot.

13. An advanced processing apparatus comprising a plurality of multi-qubit modules; each multi-qubit module comprising an apparatus in accordance with claim 1.

14. The apparatus of claim 13 wherein the plurality of multi-qubit modules are interconnected by superconducting resonators or spin-buses.

* * * * *